US009041602B2

(12) United States Patent
McCune, Jr.

(10) Patent No.: US 9,041,602 B2
(45) Date of Patent: May 26, 2015

(54) PHASED ARRAY TRANSMISSION METHODS AND APPARATUS

(76) Inventor: Earl W. McCune, Jr., Santa Clara, CA (US)

( * ) Notice: Subject to any disclaimer, the term of this patent is extended or adjusted under 35 U.S.C. 154(b) by 483 days.

(21) Appl. No.: 13/295,311

(22) Filed: Nov. 14, 2011

(65) Prior Publication Data

US 2013/0120190 A1    May 16, 2013

(51) Int. Cl.
*H01Q 3/28* (2006.01)
*H01Q 3/42* (2006.01)
*H01Q 3/26* (2006.01)
*H01Q 3/30* (2006.01)

(52) U.S. Cl.
CPC . *H01Q 3/28* (2013.01); *H01Q 3/42* (2013.01); *H01Q 3/2605* (2013.01); *H01Q 3/30* (2013.01)

(58) Field of Classification Search
CPC ............ H01Q 3/26; H01Q 3/30; H01Q 3/28; H01Q 3/36; H01Q 3/42
USPC .................. 342/368, 371, 372, 375
See application file for complete search history.

(56) References Cited

U.S. PATENT DOCUMENTS

| | | | |
|---|---|---|---|
| 6,417,712 B1 * | 7/2002 | Beards et al. | 327/248 |
| 6,441,783 B1 * | 8/2002 | Dean | 342/372 |
| 6,556,089 B2 | 4/2003 | Wood | |
| 7,092,690 B2 * | 8/2006 | Zancewicz | 455/273 |
| 7,218,180 B2 | 5/2007 | Wood | |
| 7,493,144 B2 * | 2/2009 | Natarajan et al. | 455/562.1 |
| 8,670,728 B2 * | 3/2014 | Lozhkin | 455/102 |
| 2004/0087294 A1 * | 5/2004 | Wang | 455/276.1 |
| 2013/0088383 A1 * | 4/2013 | Forstner et al. | 342/175 |

OTHER PUBLICATIONS

A. Natarajan et al., "A 77-GHz Phased-Array Transceiver with On-Chip Antennas in Silicon: Transmitter and Local LO-Path Phase Shifting," IEEE Journal on Solid-State Circuits, vol. 41, No. 12, pp. 2807-2819 (2006).
H. Hashemi et al., "A 24-GHz SiGe Phased-Array Receiver—LO Phase-Shifting Approach," IEEE Transactions on Microwave Theory and Techniques, vol. 53, No. 2, pp. 614-626 (2005).
J. Wood et al., "Rotary Traveling-Wave Oscillator Arrays: A New Clock Technology," IEEE Journal of Solid-State Circuits, vol. 36, No. 11, pp. 1654-1665 (2001).

* cited by examiner

*Primary Examiner* — Gregory C Issing
(74) *Attorney, Agent, or Firm* — Patent Law Professionals, P.C.; William E. Winters

(57) ABSTRACT

A phased array transmitter includes a plurality of vector modulators, an in-phase/quadrature (I/Q) signal generator, and a multiphase generator. The output phases of the plurality of vector modulators, and hence the direction of transmission of the phased array transmitter, are set and controlled by adjusting both the magnitude ratios of I/Q signal pairs generated by the I/Q signal generator and applied to I and Q inputs of the plurality of vector modulators and phases of a plurality of local oscillator (LO) signal phases generated by the multiphase generator and applied to LO inputs of the plurality of vector modulators. Setting and controlling the output phases of the vector modulators by varying both the magnitude ratios of the I/Q signal pairs and the phases of the LO signal phases allows the output phases of the plurality of vector modulators to be more precisely set and controlled than if the output phases were to be set and controlled only through the LO paths or only through the I/Q signal paths of the plurality of vector modulators.

15 Claims, 12 Drawing Sheets

$I_n = w_{In}I$
$Q_n = w_{Qn}Q$ $s_n(t) = w_{In}I\cos(\omega_{RF}t + \phi_{n,LO}) + w_{Qn}Q\sin(\omega_{RF}t + \phi_{n,LO}) = A(t)\cos(\omega_{RF}t + \alpha(t) + \phi_n)$ $\phi_n = \phi_{n,IQ} + \phi_{n,LO} = \tan^{-1}(w_{Qn}Q/w_{In}I) + \phi_{n,LO}$ $R_n = [(w_{In}I)^2 + (w_{Qn}Q)^2]^{1/2}$

PHASED ARRAY TRANSMISSION METHODS AND APPARATUS

FIELD OF THE INVENTION

The present invention relates in general to phase shifting of electrical signals. More particularly, the present invention relates to methods and apparatus for accurately setting and controlling the phases of electrical signals in phased array transmitters.

BACKGROUND OF THE INVENTION

Phased array transmission is a wireless transmission technique that utilizes an array of antennas known as a "phased array" to reinforce the transmission of electromagnetic signals in a desired direction while suppressing them in other undesired directions. Historically, phased array transmission has been limited to military applications or other highly-specialized applications like airport surveillance, astronomy, space probe communications, and weather research. However, technological advances and lowering costs in recent years have sparked research and development efforts in more commercial and consumer-oriented areas.

As illustrated in FIG. 1, a phased array 100 generally comprises an array of antennas 102 (i.e., "radiating elements" or "radiators") and a plurality of delay elements 104 and power amplifiers (PAs) 106 disposed in a plurality of transmission paths. The delay elements 104 are configured to delay an input radio frequency (RF) signal by different delays $\tau 1, \tau 2, \tau 3$ and $\tau 4$. The delayed RF signals are then amplified by the PAs 106 and fed to the antennas 102, which radiate the amplified and delayed RF signals into the air or space, where they spatially combine. The radiation angle 110 and transmission characteristics of the main lobe 108 of the resulting composite signal are determined by the geometrical configuration of the antennas 102 as well as the relative delays $\tau 1, \tau 2, \tau 3$ and $\tau 4$ of the delay elements 104.

The different delays $\tau 1, \tau 2, \tau 3$ and $\tau 4$ of the delay elements 104 can be implemented by simply using different lengths of transmission lines in the transmission paths between the RF input of the array 100 and the antennas 102. One limitation of that approach, however, is that the delay lines are fixed, which prevents the main lobe 108 (i.e., the "beam") of the radiation pattern from being "steered" to different directions during operation. Various types of variable-delay delay elements have been introduced in the prior art that overcome this problem. However, they are typically notorious for having low phase accuracy, particularly when operating at high frequencies, and/or have a less than desired phase resolution, which limits the ability to precisely adjust and control the direction of transmission.

BRIEF SUMMARY OF THE INVENTION

Methods and apparatus for setting and controlling the phases of electrical signals, in general, and setting and controlling the phases of a phased array transmitter, in particular, are disclosed. An exemplary phased array transmitter includes a plurality of vector modulators, an in-phase/quadrature (I/Q) signal generator configured to generate a plurality of I/Q signal pairs for the I and Q inputs of the plurality of vector modulators, and a multiphase generator configured to generate a plurality of local oscillator (LO) signal phases for the LO inputs of the plurality of vector modulators. The output phases of the plurality of vector modulators, and hence the direction of transmission of the phased array transmitter, are set and controlled by adjusting both the magnitude ratios of I/Q signal pairs applied to the I and Q inputs of the plurality of vector modulators and the phases of the plurality of LO signal phases applied to the LO inputs of the plurality of vector modulators. Setting and controlling the output phases of the vector modulators by varying both the magnitude ratios of the I/Q signal pairs and the phases of the LO signal phases allows the output phases of the plurality of vector modulators to be more precisely set and controlled, and hence the direction of transmission to be more precisely controlled, than if the output phases were to be set and controlled only through the LO paths or only through the I/Q signal paths of the plurality of vector modulators.

Further features and advantages of the invention, including descriptions of the structure and operation of the above-summarized and other exemplary embodiments of the invention, will now be described in detail with respect to accompanying drawings, in which like reference numbers are used to indicate identical or functionally similar elements.

DETAILED DESCRIPTION

Figure 1:
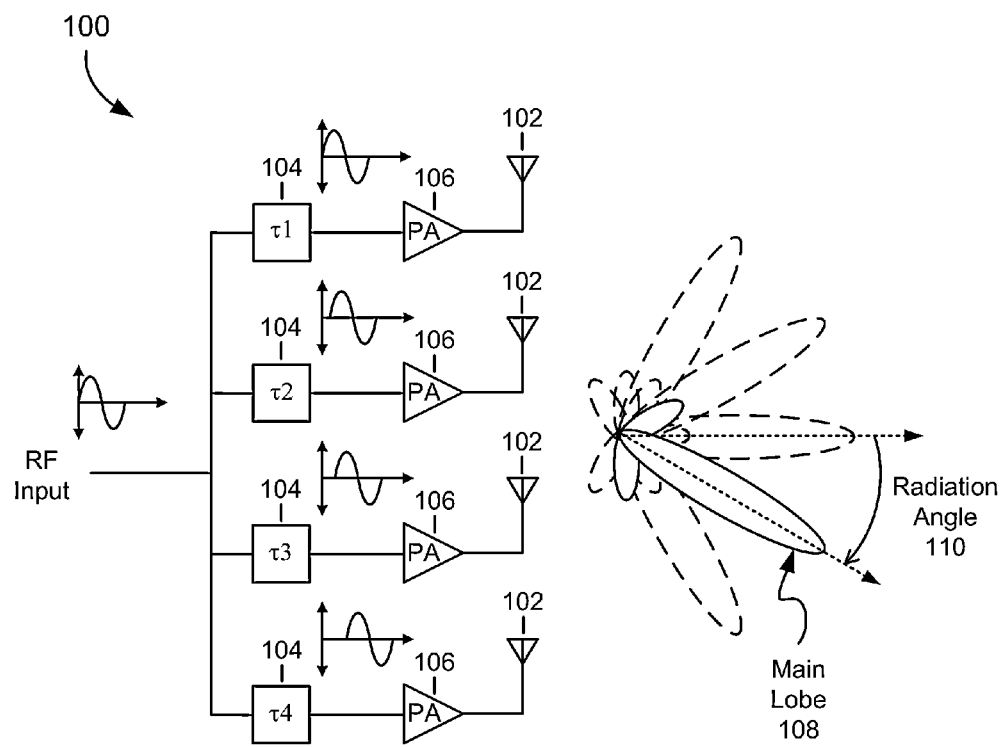
FIG. 1 is a drawing of a conventional phased array.
Figure 2:
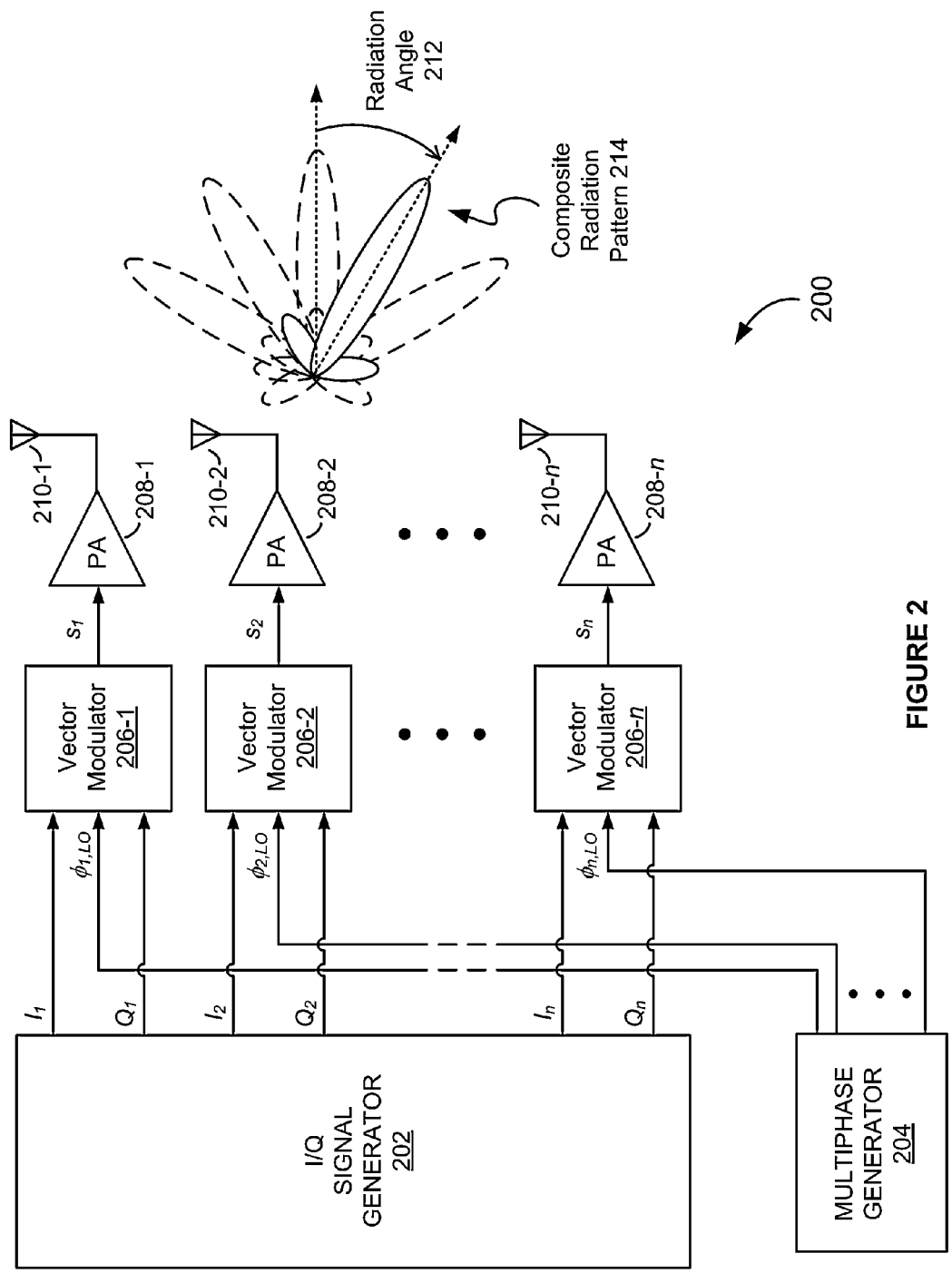
FIG. 2 is a drawing of a phased array transmitter, according to an embodiment of the present invention.

Referring to FIG. 2, there is shown a block diagram of a phased array transmitter 200, according to an embodiment of the present invention. The phased array transmitter 200 comprises an in-phase/quadrature (I/Q) signal generator 202; a multiphase generator 204; and a plurality (i.e., n, where n is a positive integer) of vector modulators 206-1, 206-2, ..., 206-n, power amplifiers (PAs) 208-1, 208-2, ..., 208-n, and antennas 210-1, 210-2, ..., 210-n configured in n separate transmission paths. The I/Q signal generator 202 is configured to generate I and Q signal pairs $(I_1, Q_1)$, $(I_2, Q_2)$, ..., $(I_n, Q_n)$ for the I and Q inputs of the n vector modulators 206-1, 206-2, ..., 206-n while the multiphase generator 204 is configured to generate n different local oscillator (LO) signals phases $\phi_{1,LO}, \phi_{2,LO}, \ldots, \phi_{n,LO}$ for LO inputs of the n vector modulators 206-1, 206-2, ..., 206-n. The LO signal phases $\phi_{1,LO}, \phi_{2,LO}, \ldots, \phi_{n,LO}$ are more accurately written as $\cos(\omega_{RF}t+\phi_{1,LO}(t)), \cos(\omega_{RF}t+\phi_{2,LO}(t)), \ldots, \cos(\omega_{RF}t+\phi_{n,LO}(t))$, where $\omega_{RF}$ is the frequency of the LO signal phases. However, to simplify notation they are referred to herein simply in terms of their phases $\phi_{1,LO}, \phi_{2,LO}, \ldots, \phi_{n,LO}$.

Each of the n vector modulators 206-1, 206-2, ..., 206-n function as both an upconverting modulator and a phase shift element. As discussed in more detail below, the phase shift of each vector modulator is set and controlled by adjusting the magnitude ratio of the I and Q signal pair $((I_1, Q_1), (I_2, Q_2)$ or $(I_n, Q_n))$ applied to its I and Q inputs and the phase of the LO signal phase $(\phi_{1,LO}, \phi_{2,LO}$ or $\phi_{n,LO})$ applied to its LO input. Controlling the phase shifts of the n vector modulators 206-1, 206-2, ..., 206-n by adjusting both the magnitude ratios of the I and Q signal pairs $(I_1, Q_1), (I_2, Q_2), \ldots, (I_n, Q_n)$ and the LO signal phases $\phi_{1,LO}, \phi_{2,LO}, \ldots, \phi_{n,LO}$ allows the radiation angle 212 of the composite radiation pattern 214 to be set and controlled with high level of precision. For a receiving application of a phased array, a similar arrangement of phase setting elements controls the LO signals applied to the receiver downconverters at each antenna element.

Figure 3:
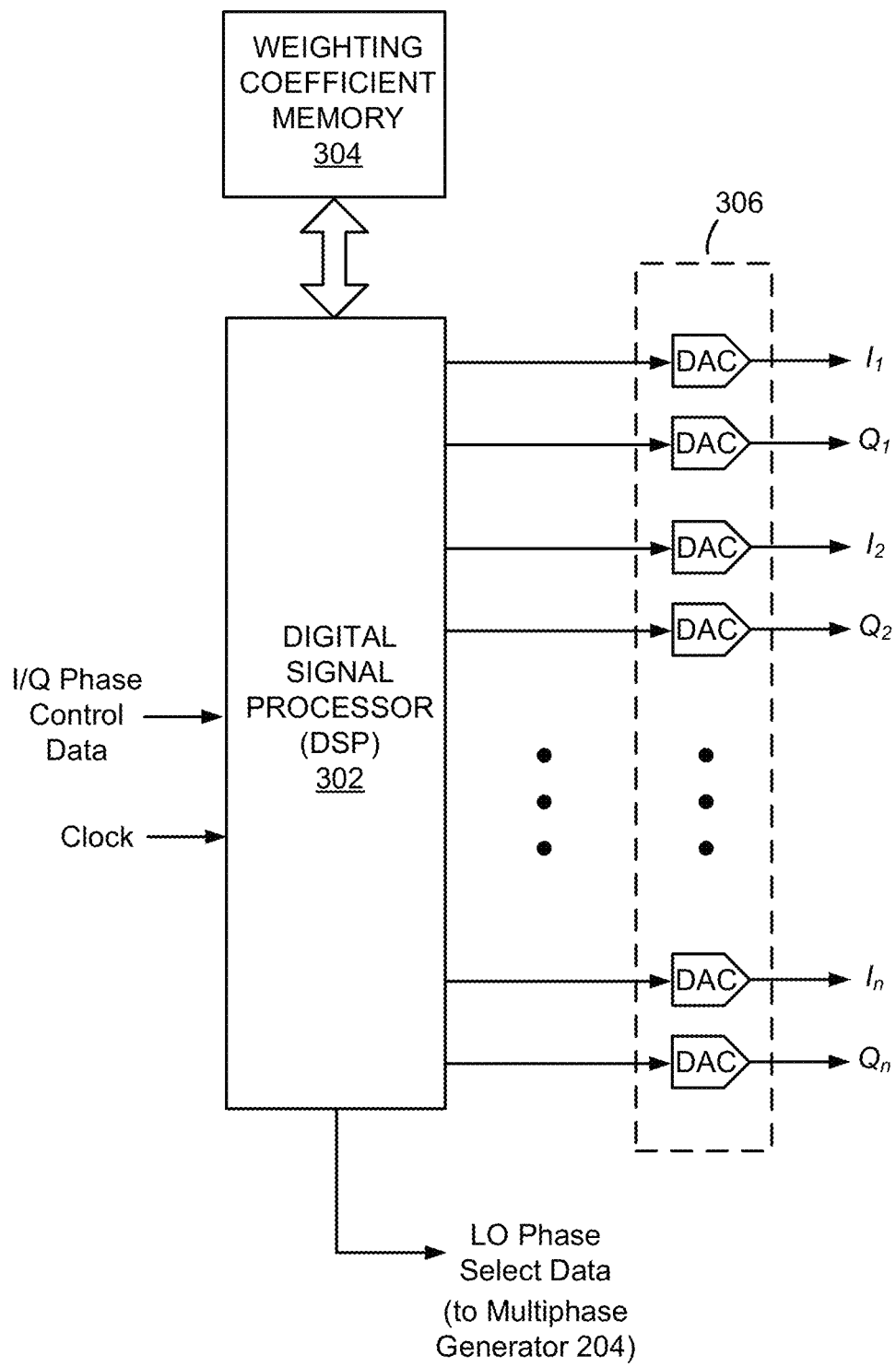
FIG. 3 is a drawing illustrating how the in-phase/quadrature (I/Q) signal generator of the phased array transmitter in FIG. 2 may be implemented using a digital signal processor (DSP), a weighting coefficient memory, and a plurality of digital-to-analog converters (DACs)

The I/Q signal generator 202 comprises hardware or a combination of hardware and software, and in one embodiment of the invention is implemented using a digital signal processor (DSP) 302, as illustrated in FIG. 3. The DSP 302 is configured to generate the I and Q signal pairs $(I_1, Q_1)$, $(I_2, Q_2)$, ..., $(I_n, Q_n)$ in response to I/Q phase control data, which may be internally generated and calculated according to a predetermined transmission algorithm, for example, or externally supplied (e.g., based on some measure of received signal quality fed back from the receiving target). In response to the I/Q phase control data, the DSP 302 multiplies (i.e., weights) an unweighted I, Q signal pair (I, Q) by in-phase and quadrature weighting coefficient pairs $(w_{I1}, w_{Q1})$, $(w_{I1}, w_{Q1})$, ..., $(w_{In}, w_{Qn})$ retrieved from a weighting coefficient memory 304. The in-phase and quadrature weighting coefficients $(w_{I1}, w_{Q1}), (w_{I1}, w_{Q1}), \ldots, (w_{In}, w_{Qn})$ may be integral or fractional and may be negative or positive, depending on the rotational requirements of the n vector modulators 206-1, 206-2, ..., 206-n. The resulting weighted digital/and Q signal pairs are converted to the desired analog signal pairs $(I_1, Q_1)$, $(I_2, Q_2), \ldots, (I_n, Q_n)$ using digital-to-analog converts (DACs) 306.

The relative phase shifts of the n vector modulator 206-1, 206-2, ..., 206-n are determined, in part, by the magnitude ratios $Q_1/I_1, Q_2/I_2, \ldots, Q_n/I_n$ of the weighted signal pairs $(I_1, Q_1), (I_2, Q_2), \ldots, (I_n, Q_n)$ or, more specifically, by the arctangents (i.e., inverse tangents) $\tan^{-1}(Q_1/I_1), \tan^{-1}(Q_2/I_2), \ldots, \tan^{-1}(Q_n/I_n)$, of the magnitude ratios $Q_1/I_1, Q_2/I_2, \ldots, Q_n/I_n$ of the weighted signal pairs $(I_1, Q_1)$, $(I_2, Q_2), \ldots, (I_n, Q_n)$. Depending on the application, the DSP 302 is configured to either hold the magnitude ratios $Q_1/I_1, Q_2/I_2, \ldots, Q_n/I_n$ constant or dynamically vary the magnitude ratios over time. For applications in which the receiving target is non-stationary (i.e., is a mobile target), the DSP 302 is configured to dynamically modify the magnitude ratios $Q_1/I_1, Q_2/I_2, \ldots, Q_n/I_n$ according to a predetermined scanning algorithm or in response to externally received I/Q phase control data, which in one embodiment is based on a measure of signal strength or signal quality (e.g., signal-to-noise ratio (SNR) or bit error rate (BER)) of signals received at the mobile target. Dynamically modifying the magnitude ratios $Q_1/I_1, Q_2/I_2, \ldots, Q_n/I_n$ while also controlling the phases of the LO signal phases $\phi_{1,LO}, \phi_{2,LO}, \ldots, \phi_{n,LO}$ applied to the LO inputs of the n vector modulators 206-1, 206-2, ..., 206-n allows the radiation angle 212 of the transmitted beam to be precisely controlled as the mobile target moves.

Figure 4:
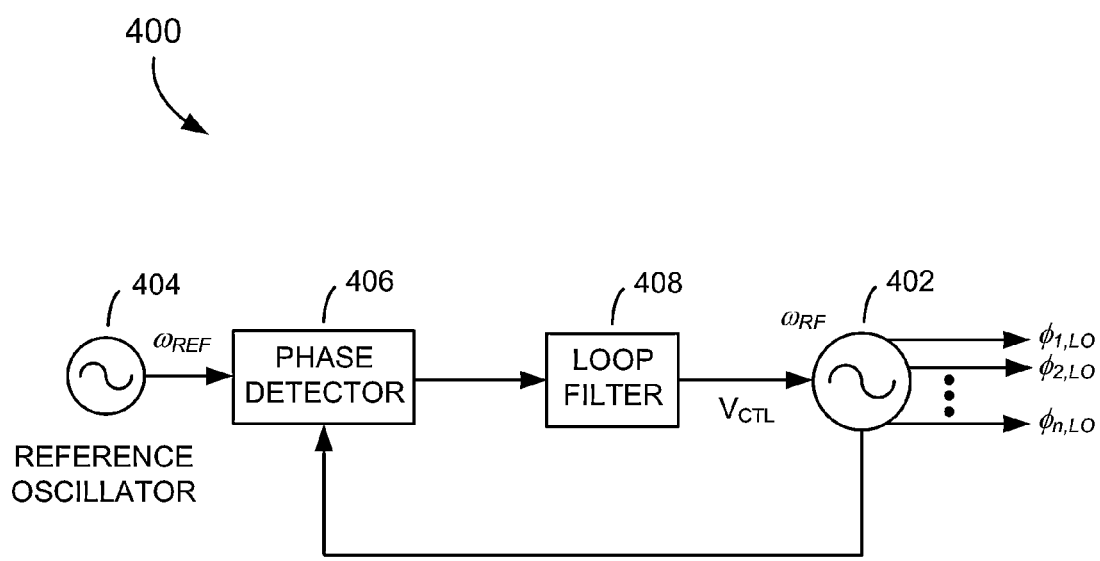
FIG. 4 is a drawing of a multiphase oscillator configured in a phase-locked loop (PLL), which may be used to implement the multiphase generator of the phased array transmitter in FIG. 2.

The multiphase generator 204 can be implemented in various ways. In one embodiment of the invention it comprises a multiphase voltage controlled oscillator (VCO) 402 disposed in a phase-locked loop (PLL) 400, as illustrated in FIG. 4. The VCO 402 operates to generate the n local oscillator LO signal phases $\phi_{1,LO}, \phi_{2,LO}, \ldots, \phi_{n,LO}$ one of which is fed back to a phase detector 406. The phase detector 406 generates an error signal based on the phase difference (i.e., phase error) between a reference signal provided by a reference oscillator 404 and the fed back LO signal phase. The error signal is filtered by a low-pass filter 408 and applied to the control input of the VCO 402, which responds by adjusting its output frequency $\omega_{RF}$ in a direction that minimizes the phase error. Phase locking the PLL 400 in this manner forces the frequency $\omega_{RF}$ of the LO signal phases $\phi_{1,LO}, \phi_{2,LO}, \ldots, \phi_{n,LO}$ to conform to the reference frequency $\omega_{REF}$ of the reference signal.

Figure 5:
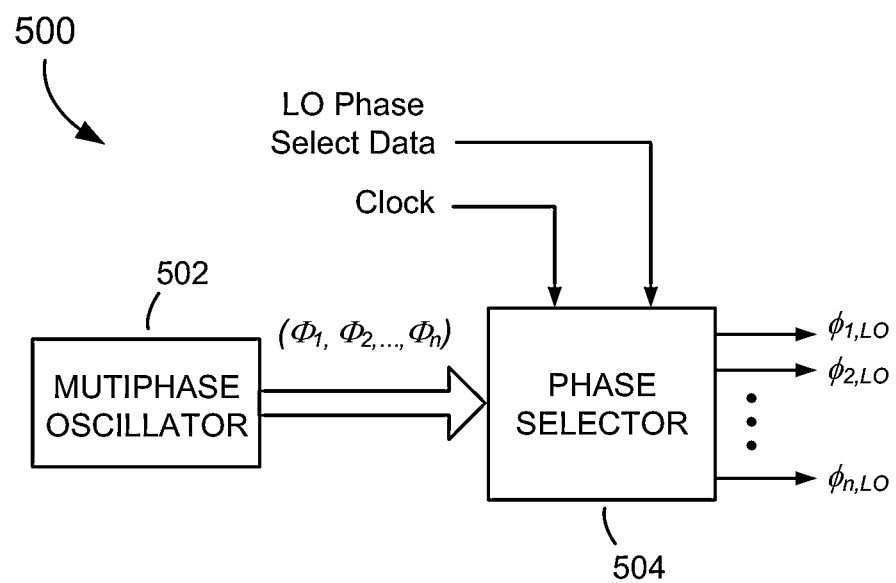
FIG. 5 is a drawing of a phase-selectable multiphase generator that may be used to implement the multiphase generator of the phased array transmitter in FIG. 2.

In one embodiment of the invention, the LO signal phases $\phi_{1,LO}, \phi_{2,LO}, \ldots, \phi_{n,LO}$ from the multiphase generator 204 are hardwired (i.e., are directly and permanently connected to) the LO inputs of the n vector modulators 206-1, 206-2, ..., 206-n. In another embodiment the LO signal phases $\phi_{1,LO}, \phi_{2,LO}, \ldots, \phi_{n,LO}$ are selected from a phase-selectable multiphase generator 500, as illustrated in FIG. 5. The phase-selectable multiphase generator 500 includes a multiphase oscillator 502 (e.g., a VCO configured within a PLL, similar to as in FIG. 4) and a phase selector 504. The multiphase oscillator 502 generates n discrete phases $\Phi_1, \Phi_2, \ldots, \Phi_n$, which the phase selector 504 selects from, in response to LO phase select data from the DSP 302 for example, to produce each of the LO signal phases $\phi_{1,LO}, \phi_{2,LO}, \ldots, \phi_{n,LO}$. Any one of the n discrete phases $\Phi_1, \Phi_2, \ldots, \Phi_n$ may be selected as the LO for any one of the n vector modulators 206-1, 206-2, ..., 206-n. Similar to the I/Q phase control data used to control the magnitude ratios $Q_1/I_1, Q_2/I_2, \ldots, Q_n/I_n$ of the I and Q signal pairs $(I_1, Q_1), (I_2, Q_2), \ldots, (I_n, Q_n)$, the LO phase select data may be calculated in accordance with some predetermined transmit algorithm or may be based on the strength or quality of the transmitted signal at the receiving target.

Figure 6:
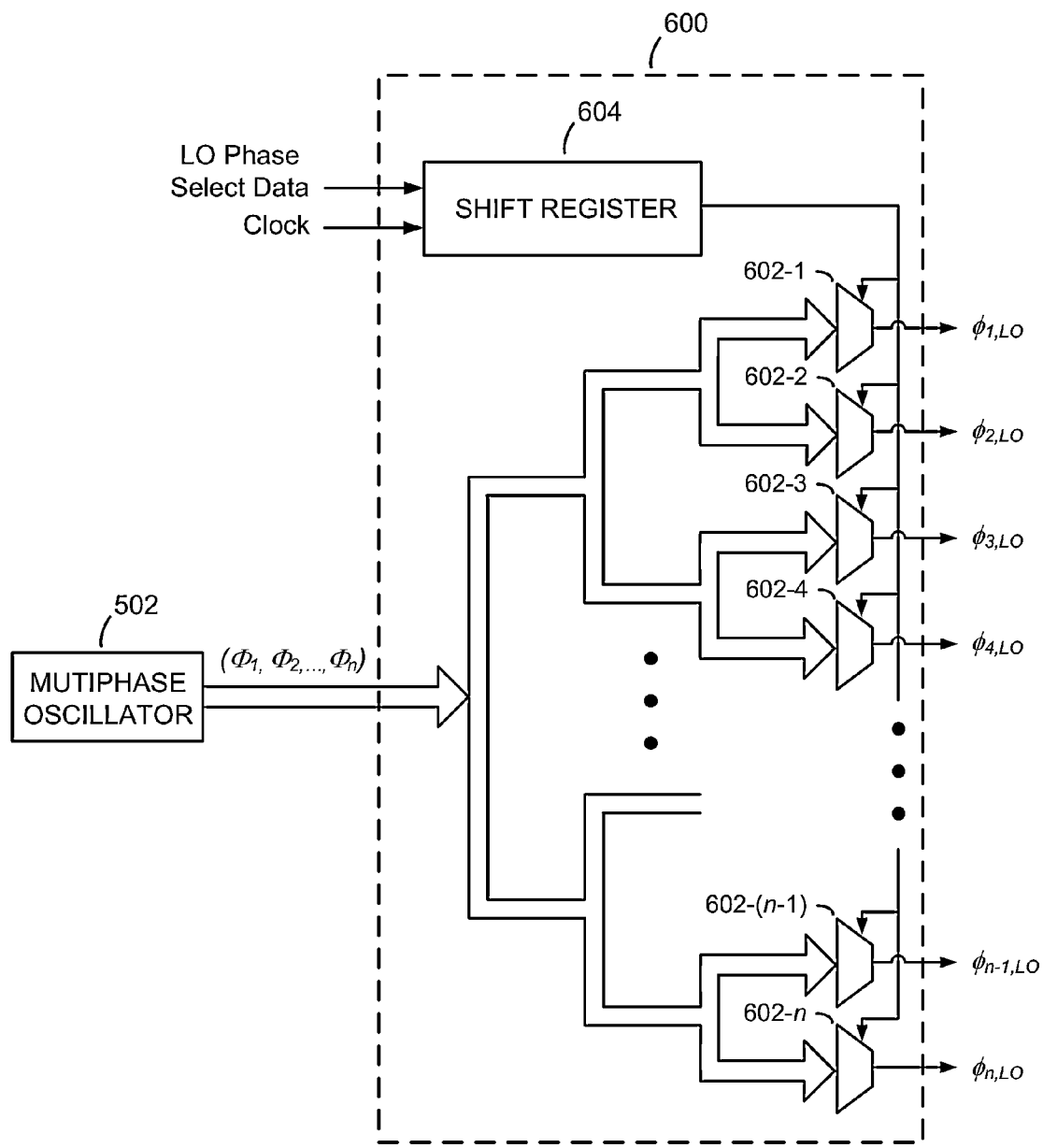
FIG. 6 is a drawing illustrating one way in which the phase selector of the phase-selectable multiphase generator in FIG. 5 may be implemented.

FIG. 6 is a drawing illustrating one way in which the phase selector 504 may be implemented. This approach is similar to the phase select approach described in H. Hashemi et al., "A 24-GHz SiGe Phased array Receiver—LO Phase-Shifting Approach," *IEEE Transactions on Microwave Theory and Techniques*, vol. 53, no. 2, pp. 614-626, February 2005, which is incorporated by reference. The phase selector 600 comprises n:1 multiplexers 602-1, 602-2, ..., 602-n and an LO phase select shift register 604. Each of the n:1 multiplexers 602-1, 602-2, ..., 602-n has a $\log_2$n-bit select input for receiving LO phase select data shifted through the LO phase select shift register 604. The n:1 multiplexers 602-1, 602-2, ..., 602-n thus select from among the n discrete phases $\Phi_1, \Phi_2, \ldots, \Phi_n$ depending on the values of the LO phase select data applied to their select inputs.

Figure 7:
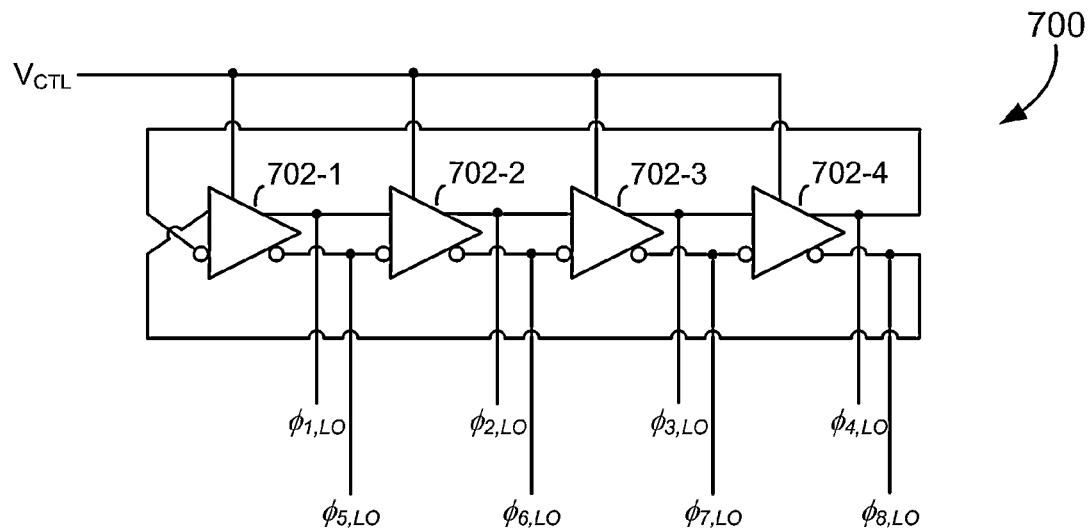
FIG. 7 is a drawing of a ring oscillator which may be used to implement the multiphase oscillator of the PLL in FIG. 4 or the multiphase oscillator of the phase-selectable multiphase generator in FIGS. 5 and 6.
Figure 8:
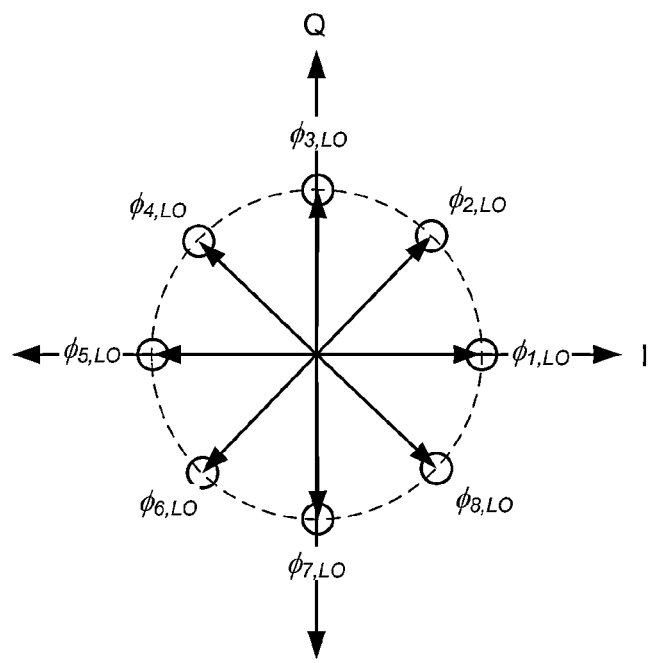
FIG. 8 is a vector diagram showing the phase relationships among the LO signal phases $\phi_{1,LO}, \phi_{2,LO}, \ldots, \phi_{8,LO}$ generated and provided by the ring oscillator in FIG. 7.

The multiphase oscillator (i.e., VCO 402) of the PLL 400 in FIG. 4 and the multiphase oscillator 502 of the phase-selectable multiphase generator 500 in FIGS. 5 and 6 can be implemented in various ways. In one embodiment of the invention, for example, a four-stage ring oscillator 700 is used, as illustrated in FIG. 7. (A ring oscillator having more or less than four stages may be alternatively used, depending on the application, as will be appreciated by those of ordinary skill in the art.) The ring oscillator 700 has four substantially identical differential amplifiers 702-1, 702-2, 702-3 and 702-4 that are connected in a ring. The differential output of each differential amplifier is connected to the differential input of the next differential amplifier in the ring, except for the differential output of differential amplifier 702-4 which is cross-connected with the different input of differential amplifier 702-1. The ring oscillator 700 provides n=8 LO signal phases $\phi_{1,LO}$, $\phi_{2,LO}, \ldots, \phi_{8,LO}$, i.e., has a $\log_2 8 = 3$ bit resolution, with phase relationships shown in the vector diagram in FIG. 8. Each LO signal phase $\phi_{1,LO}, \phi_{2,LO}, \ldots, \phi_{8,LO}$ oscillates at a frequency $f_{osc} = 1/(2N_{stage}\tau)$, where $N_{stage}$ is the number of stages (in this example, $N_{stage}$=4) and $\tau$ is the signal delay presented by each differential amplifier stage.

Figure 9:
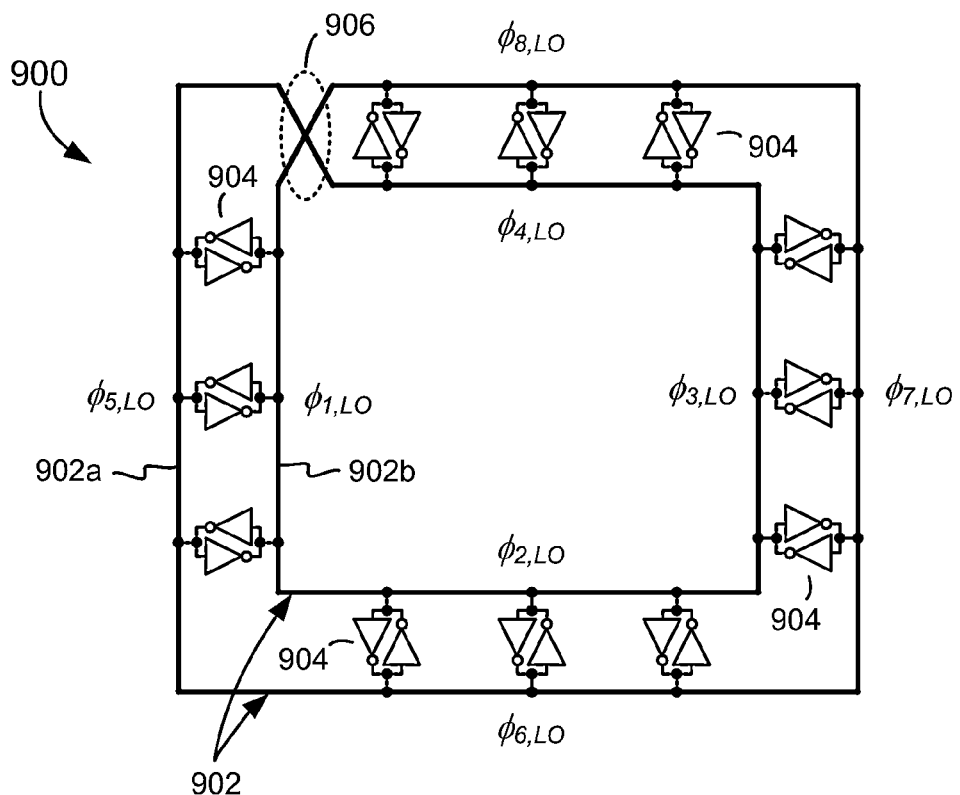
FIG. 9 is a drawing of a rotary traveling wave oscillator (RTWO), which may be used to implement the multiphase oscillator of the PLL in FIG. 4 or the multiphase oscillator of the phase-selectable multiphase generator in FIGS. 5 and 6.
Figure 10:
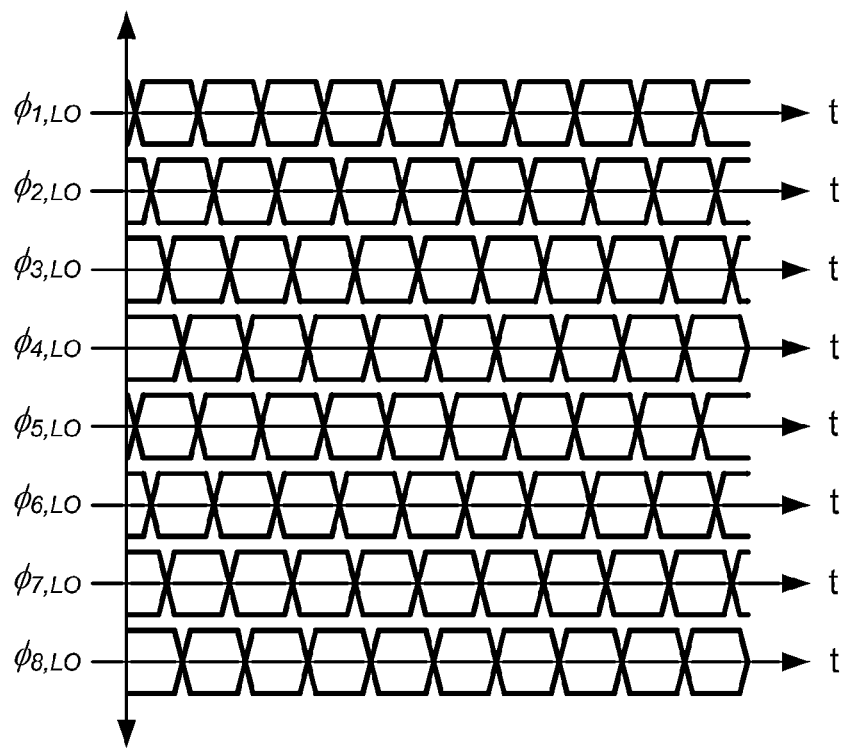
FIG. 10 is a signal diagram showing the phase relationships among the LO signal phases $\phi_{1,LO}, \phi_{2,LO}, \ldots, \phi_{8,LO}$ generated by the RTWO in FIG. 9.

FIG. 9 is a drawing of another type of multiphase oscillator, known as a rotary traveling wave oscillator (RTWO), that may be alternatively used. The RTWO 900 comprises a differential transmission line 902 interposed with a plurality of cross-coupled inverters 904. The differential transmission line 902 includes transmission line segments 902a and 902b that are generally parallel but intersect at a crossover 906, resulting in the differential transmission line 902 taking the form of a Moebius strip. The oscillating frequency $f_{osc}$ of the RTWO 900 is $(½)\times(L_o C_o)^{-1/2}$, where $L_o$ and $C_o$ are the inductance and capacitance of the transmission line 902. n=8 LO signal phases $\phi_{1,LO}, \phi_{2,LO}, \ldots, \phi_{8,LO}$ are extracted from taps at equally spaced positions along the transmission line 902. FIG. 10 is a signal diagram showing the phase relationships among the n=8 LO signal phases $\phi_{1,LO}, \phi_{2,LO}, \ldots, \phi_{8,LO}$. Additional details of RTWOs that may be modified or adapted for use in the present invention may be found in J. Wood et al., *Rotary Traveling-Wave Oscillator Arrays: A New Clock Technology*, IEEE Journal of Solid-Sate Circuits, vol. 36, no. 11, November 2001 and U.S. Pat. Nos. 6,556,089 and 7,218,180 to Wood, all of which are hereby incorporated by reference.

Figure 11:
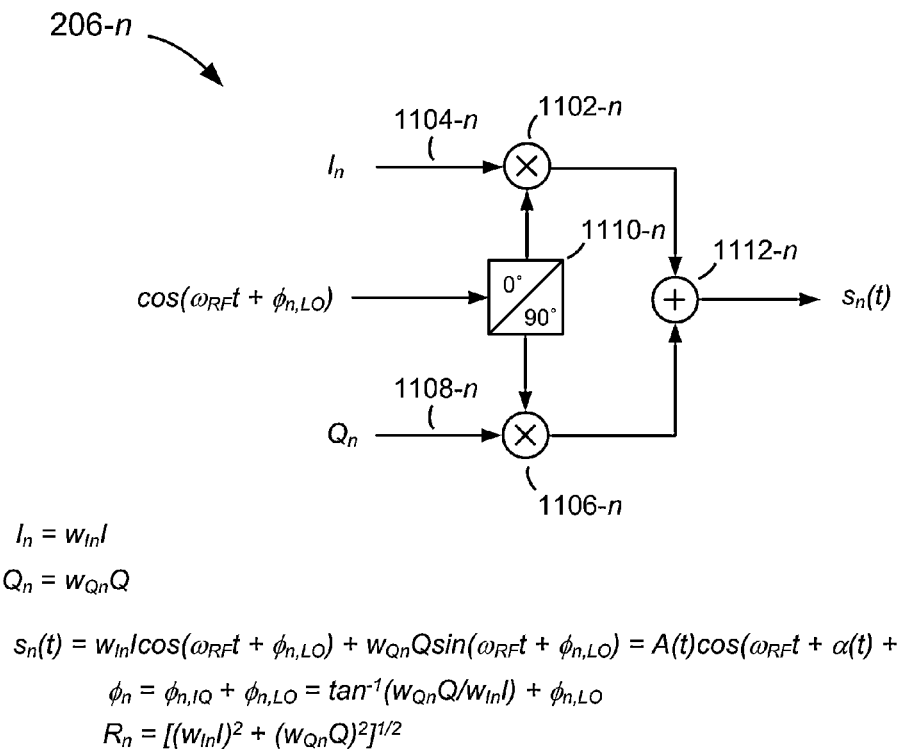
FIG. 11 is a drawing showing the salient elements of one of the vector modulators of the phased array transmitter in FIG. 2.

FIG. 11 is a drawing showing the salient functional elements of one of the vector modulators of the phased array transmitter 200, specifically, the nth vector modulator 206-n. (The other vector modulators 206-1, 206-2, ..., 206-n–1 have a substantially similar construction, as will be understood by those of ordinary skill in the art.) As shown, the nth vector modulator 206-n comprises an in-phase mixer (or multiplier) 1102-n disposed in an in-phase arm 1104-n, a quadrature mixer (or multiplier) 1106-n disposed in a quadrature arm 1108-n, a quadrature phase splitter 1110-n, and a combiner 1112-n. The nth LO signal phase $\phi_{n,LO}$ from the multiphase generator 204 (or from the phase-selectable multiphase generator 500, if it is used) is applied to the input of the quadrature phase splitter 1110-n. The quadrature phase splitter 1110-n is configured to pass the nth LO signal phase $\phi_{n,LO}$ to a first input of the in-phase mixer 1102-n in the in-phase arm 1104-n and also generate a ninety-degree phase-shifted version of the nth LO signal phase, i.e., $\phi_{n,LO}+90°$, which is applied to a first input of the quadrature mixer 1106-n in the quadrature arm 1108-n. (Note that for differential multiphase generators capable of generating differential in-phase and quadrature outputs, such as the ring oscillator 700 in FIG. 7 and the RTWO 900 in FIG. 9, the quadrature phase splitter 1110-n is not needed since the nth LO signal phase $\phi_{n,LO}$ and the ninety-degree phase-shifted version of the nth LO signal phase $\phi_{n,LO}+90°$ may both be obtained directly from the differential multiphase generator.) Second inputs of the in-phase and quadrature mixers 1102-n and 1106-n are configured to receive the weighted nth I and Q signal pair $I_n = w_{In}I$ and $Q_n = w_{Qn}Q$ (i.e., $(I_n, Q_n)$) from the DSP 302, where $w_{In}$ and $w_{Qn}$ are the nth in-phase and quadrature weighting coefficients retrieved from the weighting coefficient memory 304 in generating the nth weighted I and Q signal pair $(I_n, Q_n)$. The in-phase mixer 1102-n mixes the weighted I signal component $I_n$ with the nth LO signal phase $\phi_{n,LO}$, producing an in-phase output signal $I_n \cos(\omega_{RF}t+\phi_{n,LO})$. Meanwhile, the quadrature mixer 1106-n mixes the weighted Q signal component $Q_n$ with the ninety-degree phase-shifted version $\phi_{n,LO}+90°$ of the nth LO signal phase $\phi_{n,LO}$, producing a quadrature output signal $Q_n \sin(\omega_{RF}t+\phi_{n,LO})$. The combiner 1112-n combines the in-phase and quadrature output signals $I_n \cos(\omega_{RF}t+\phi_{n,LO})$ and $Q_n \sin(\omega_{RF}t+\phi_{n,LO})$, producing the final nth phase-shifted signal $s_n(t) = I_n \cos(\omega_{RF}t+\phi_{n,LO}) + Q_n \sin(\omega_{RF}t+\phi_{n,LO}) = w_{In}I \cos(\omega_{RF}t+\phi_{n,LO}) + w_{Qn}Q \sin(\omega_{RF}t+\phi_{n,LO})$, which can be equivalently written as $s_n(t) = A(t)\cos(\omega_{RF}t+\alpha(t)+\phi_n(t))$, where $A(t)$ represents any amplitude modulation contained in the original I and Q signals (A=constant if no amplitude modulation is present), $\alpha(t)$ represents any angle modulation contained in the original I and Q signals ($\alpha$=0 if no angle modulation is present), and $\phi_n(t)$ is the final output phase of the nth phase-shifted signal $s_n(t)$. (Note that it is assumed that the values of $w_{In}$ and $w_{Qn}$ are restricted so that the magnitude $[(w_{In}I)^2+(w_{Qn}Q)_2]^{1/2}$ always equals unity or some other constant. However, that restriction is not necessary and may be disregarded in some circumstances, for example, in order to provide an additional mechanism for controlling null positions and/or side lobe placements in the composite radiation pattern 214.) For example, setting the magnitude $[(w_{In}I)^2+(w_{Qn}Q)^2]^{1/2}$ to values other than unity provides for variation of the signal power individually at each antenna element. This supports the capability of aperture power profiling, which is necessary for side lobe control. Together these capabilities sufficiently support the requirements for array control algorithms known as 'Smart Antenna'.

Each of the output phases $\phi_1, \phi_2, \ldots, \phi_n$ of each of the vector modulators 206-1, 206-2, ..., 206-n has two phase components a first component that depends on the magnitude ratio of the I and Q signal pair applied to the vector modulator's I and Q inputs and a second component that depends on the LO signal phase applied to its LO input. For example, the output phase $\phi_n = \phi_{n,IQ} + \phi_{n,LO}$ of the nth vector modulator 206-n has a first phase component $\phi_{n,IQ} = \tan^{-1}(Q_n/I_n)$ and a second phase component $\phi_{n,LO}$. The radiation angle 212 of the composite radiation pattern 214 can therefore be controlled by controlling the Q/I magnitude ratios of the I and Q signal pairs $(I_1, Q_1), (I_2, Q_2), \ldots, (I_n, Q_n)$ and the phases of the LO signal phases $\phi_{1,LO}, \phi_{2,LO}, \ldots, \phi_{n,LO}$ applied to LO inputs of the n vector modulators 206-1, 206-2, ..., 206-n.

Figure 12:
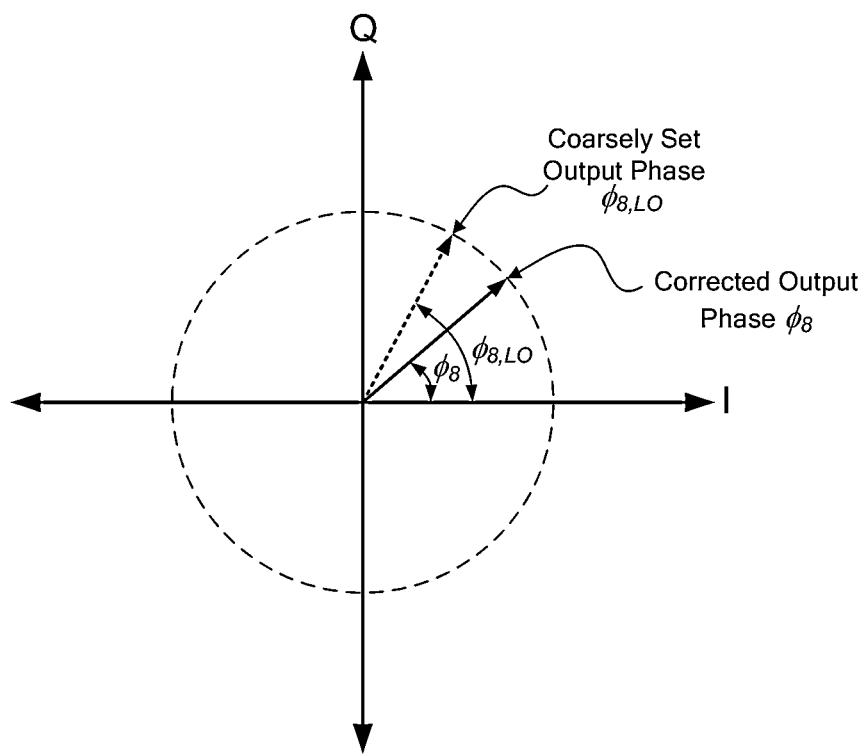
FIG. 12 is a vector diagram illustrating how the output phase of one of the vector modulators of the phased array transmitter in FIG. 2 is corrected from a coarsely set output phase to a final and more precise output phase, according to an embodiment of the present invention.

In one embodiment of the invention, the LO signal phases $\phi_{1,LO}, \phi_{2,LO}, \ldots, \phi_{n,LO}$ from the multiphase generator 204 are used to coarsely set the phases of the phase-shifted signals $s_1(t), s_2(t), \ldots, s_n(t)$ and the weighted I and Q signal pairs ($I_1$, $Q_1$), $(I_2, Q_2)$, . . . , $(I_n, Q_n)$ are adjusted to finely rotate the phases of the phase-shifted signals $s_1(t)$, $s_2(t)$, . . . , $s_n(t)$ to their final desired output phases $\phi_1$, $\phi_2$, . . . , $\phi_n$. The bit resolution of the DACs 306 used to generate the weighted I and Q signal pairs $(I_1, Q_1)$, $(I_2, Q_2)$, . . . , $(I_n, Q_n)$ pairs is set during design so that the resolution of the phase correction effected by the weighted I and Q signal pairs $(I_1, Q_1)$, $(I_2, Q_2)$, . . . , $(I_n, Q_n)$ is greater than the phase resolution of the multiphase generator 204. FIG. 12 is a vector diagram illustrating how the output phase of the eighth vector modulator 206-8 is corrected according to this embodiment of the invention when an n=8 multiphase generator 204 is used. The output phase is coarsely set by applying the eighth LO signal phase $\phi_{8,LO}$ to the LO input of the eighth vector modulator 206-8. The higher resolution weighted eighth I and Q signal pair $(I_8, Q_8)$ is applied to the I and Q inputs of the eight vector modulator 206-8, causing the output phase of the eighth vector modulator 206-8 to rotate from the coarsely set output phase of $\phi_{8,LO}$ to the final desired (i.e., "corrected") output phase $\phi_8$. Using both the LO and I/Q signal paths to set and control the final output phase $\phi_8$ therefore allows the final output phases of the vector modulators to be controlled more precisely than if the output phases were to be controlled only through the LO path or only through the I/Q signal paths of the vector modulators.

Figure 13:
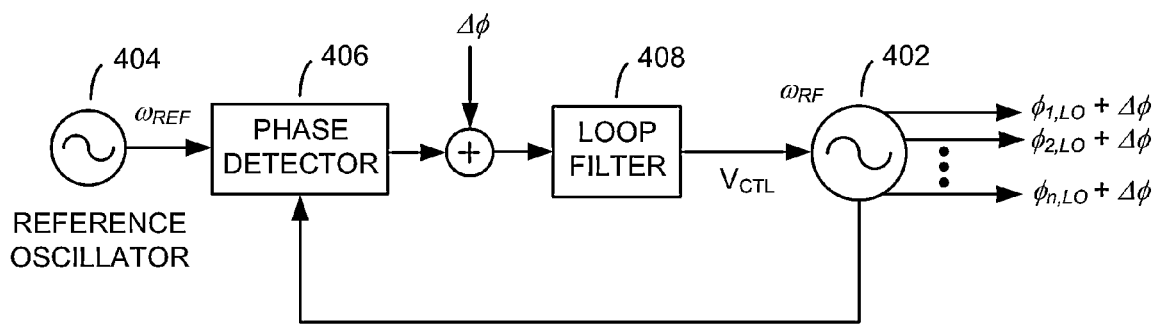
FIG. 13 is a drawing of a PLL-based multiphase generator that has been modified to finely shift its output LO signal phases in response to a small injected phase shift $\Delta\phi$.

In the exemplary embodiment above, the output phases of the n vector modulators 206-1, 206-2, . . . , 206-$n$ are coarsely set by the LO signal phases $\phi_{1,LO}$, $\phi_{2,LO}$, . . . , $\phi_{n,LO}$ and corrected to their final desired output phases $\phi_1$, $\phi_2$, . . . , $\phi_n$ using higher resolution I and Q signal pairs $(I_1, Q_1)$, $(I_2, Q_2)$, . . . , $(I_n, Q_n)$. In an alternative embodiment, the converse is performed. Specifically, lower bit resolution I and Q signal pairs $(I_1, Q_1)$, $(I_2, Q_2)$, . . . , $(I_n, Q_n)$ are used to coarsely set the output phases of the n vector modulators 206-1, 206-2, . . . , 206-$n$ while higher phase resolution LO signal phases $\phi_{1,LO}$, $\phi_{2,LO}$, . . . , $\phi_{n,LO}$ from the multiphase generator 204 are used to finely shift and correct phase inaccuracies resulting from the use of the lower bit resolution I and Q signal pairs $(I_1, Q_1)$, $(I_2, Q_2)$, . . . , $(I_n, Q_n)$. One way of correcting the output phase inaccuracies when a PLL-based multiphase oscillator is used is to simply inject a small phase shift $\Delta\phi$ into the PLL 400 between the output of the phase detector 406 and the input of the loop filter 408, as illustrated in FIG. 13. The amount of phase shift $\Delta\phi$ may be based on, for example, the strength or quality of the transmitted signal received at the receiving target. For a receiving application, the phase shift $\Delta\phi$ may be based on maximizing the local received strength, or on a minimization of received interference, or some combination of these.

Figure 14:
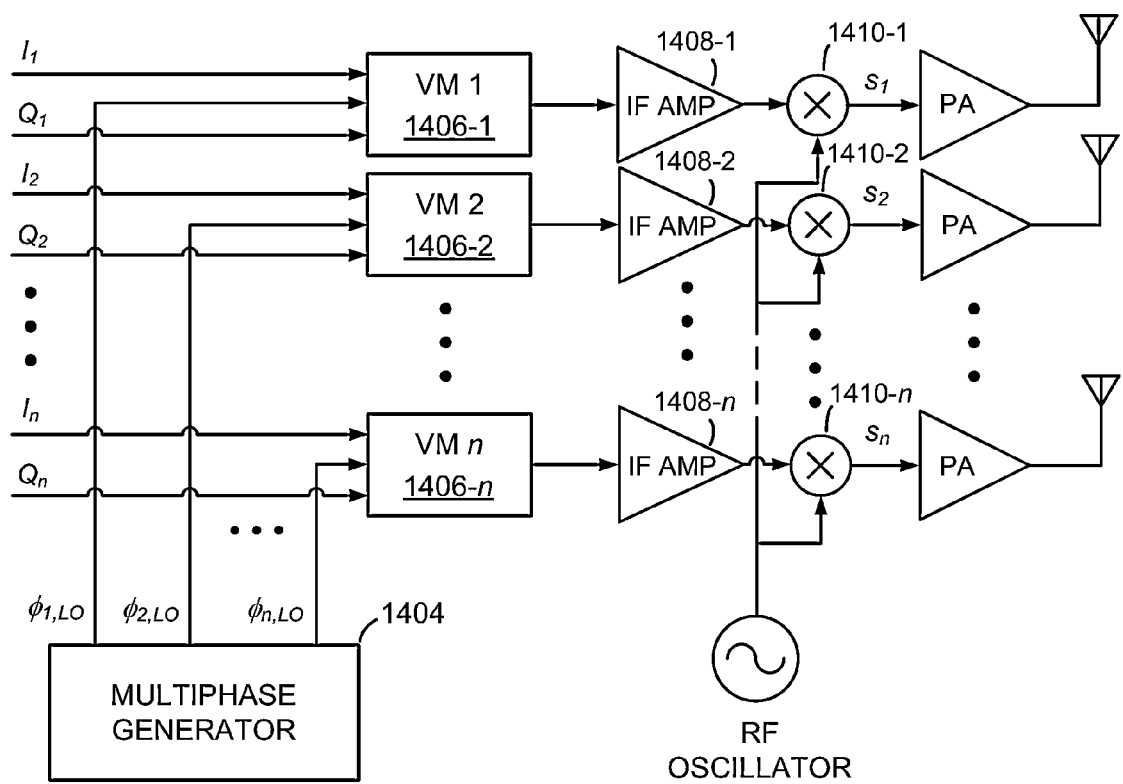
FIG. 14 is a drawing of a portion of a phased array transmitter according to another embodiment of the present invention, in which weighted I and Q signal pairs $(I_1, Q_1)$, $(I_2, Q_2)$, ..., $(I_n, Q_n)$ are upconverted and phase shifted at an intermediate frequency (IF) before being upconverted to RF.

The n vector modulators 206-1, 206-2, . . . , 206-$n$ of the phase array transmitter 200 described above are configured to upconvert the weighted I and Q signal pairs $(I_1, Q_1)$, $(I_2, Q_2)$, . . . , $(I_n, Q_n)$ directly to RF using LO signal phases $\phi_{1,LO}$, $\phi_{2,LO}$, . . . , $\phi_{n,LO}$ having an RF frequency $\omega_{RF}$. It should be mentioned, however, that in other embodiments of the invention, and as illustrated in FIG. 14, n vector modulators (VMs) 1406-1, 1406-2, . . . , 1406-$n$ are configured to upconvert the weighted I and Q signal pairs $(I_1, Q_1)$, $(I_2, Q_2)$, . . . , $(I_n, Q_n)$ to an intermediate frequency (IF) $\omega_{IF}$, according to IF LO signal phases generated by an IF multiphase generator 1404, before upconverting to RF. The phase shifts (rotations) introduced by the n vector modulators 1406-1, 1406-2, . . . , 1406-$n$ are here performed at IF, rather than at RF. After being upconverted and shifted at IF, the shifted and IF-upconverted signals are amplified by IF amplifiers 1408-1, 1408-2, . . . , 1408-$n$ and, finally, upconverted to RF by RF mixers 1410-1, 1410-2, . . . , 1410-$n$.

While various exemplary and preferred embodiments of the present invention have been described, it will be apparent to those of ordinary skill in the art upon review of this disclosure that various changes in form and detail may be made to the invention without departing from the true spirit and scope of the invention. The full scope of the invention should therefore not be restricted by reference to specific details of the exemplary embodiments described above but, instead, should be determined with reference to the appended claims, along with the full scope of equivalents to which such claims are entitled.

What is claimed is:

1. An apparatus for controlling phases of electrical signals in a phased array transmitter, comprising:
    an in-phase/quadrature (I/Q) signal generator configured to generate a plurality of different I/Q signal pairs, each different I/Q signal pair having an I/Q magnitude ratio that is individually set and controlled by the I/Q signal generator;
    a multiphase generator configured to generate a plurality of local oscillator (LO) signals, each LO signal having an LO signal phases; and
    a plurality of vector modulators, each vector modulator having in-phase and quadrature inputs configured to receive a different one of the I/Q signal pairs generated by said I/Q signal generator and an LO input configured to receive one of the LO signals generated by said multiphase generator, said plurality of vector modulators configured to generate a plurality of vector modulator output signals having a plurality of output phases determined by
    both the I/Q magnitude ratios of the plurality of I/Q signal pairs received from said I/Q signal generator and the LO signal phases of the LO signals received from said multiphase generator.

2. The apparatus of claim 1, wherein said multiphrase generator and plurality of vector modulators are configured to coarsely set the output phases of the plurality of the plurality of vector modulator output signals and said I/Q signal generator and plurality of vector modulators are configured to finely set the output phases of the plurality of vector modulator output signals.

3. The apparatus of claim 1, wherein said I/Q signal generator and said plurality of vector modulators are configured to coarsely set the output phases of the plurality of vector modulator output signals and said multiphase generator and plurality of vector modulators are configured to finely set the set output phases of the plurality of vector modulator output signals.

4. The apparatus of claim 1, wherein said I/Q signal generator comprises a digital signal processor (DSP) configured to generate digital I/Q signal pairs, and in generating said plurality of different I/Q signal pairs said DSP is configured to digitally weight in-phase and quadrature components of the digital I/Q signal pairs.

5. The apparatus of claim 4, wherein said DSP is further configured to control which LO signals from said multiphase generator are applied to the LO inputs of said plurality of vector modulators.

6. The apparatus of claim 4, further comprising a plurality of digital-to-analog converters (DACs) configured to convert digital I/Q signal pairs from said DSP to analog I/Q signal pairs, said DACs having a bit resolution high enough to allow said analog I/Q signal pairs to be used to correct for phase inaccuracies in the output phases of the plurality of vector modulator output signals.

7. The apparatus of claim 1, further comprising:
a plurality of power amplifiers (PAs) configured to receive the plurality of vector modulator output signals and produce a plurality of RF signals; and
a plurality of antennas coupled to outputs of said plurality of PAs configured to radiate said plurality of RF signals and produce a composite radiation pattern having a radiation angle determined by the I/Q magnitude ratios of the I/Q signal pairs applied to the I/Q inputs of said plurality of vector modulators and the LO signal phases of the plurality LO signals applied to the LO inputs of said plurality of vector modulators.

8. The apparatus of claim 1, further comprising:
a plurality of intermediate frequency (IF) amplifiers configured to receive the plurality of vector modulator output signals and produce a plurality of IF output signals;
a plurality of radio frequency (RF) upconverters configured to upconvert said plurality of IF output signals to a plurality of RF signals; and
a plurality of antennas configured to radiate said plurality of RF signals and produce a composite radiation pattern having a radiation angle determined by the I/Q magnitude ratios of the I/Q signal pairs applied to the I/Q inputs of said plurality of vector modulators and the LO signal phases of the plurality LO signals applied to the LO inputs of said plurality of vector modulators.

9. A method of setting and controlling phases of electrical signals in a phased array transmitter, comprising:
generating a plurality of in-phase/quadrature (I/Q) signal pairs, each I/Q signal pair having an I/Q magnitude ratio;
individually controlling the I/Q magnitude ratio of each of the generated I/Q signal pairs;
generating a plurality of local oscillator (LO) signals, each LO signal having an LO signal phase;
applying the I/Q signal pairs of the generated plurality of I/Q signal pairs to I/Q inputs of a plurality of vector modulators;
applying LO signals from the generated plurality of LO signals to LO inputs of said plurality of vector modulators; and
generating a plurality of vector modulator output signals having a plurality of phases that are determined by both the I/Q magnitude ratios of the I/Q signal pairs applied to the I/Q inputs of said plurality of vector modulators and the LO signal phases of the LO signals applied to the LO inputs of said plurality of vector modulators.

10. The method of claim 9, wherein generating said plurality of LO signals includes shifting the phases of said plurality of LO signals in accordance with a predetermined transmit algorithm.

11. The method of claim 9, wherein generating said plurality of LO signals includes shifting the phases of said plurality of LO signals based on the strength or quality of a signal received at a receiving target.

12. The method of claim 9, wherein the phases of said plurality of vector modulator output signals are coarsely set according to the I/Q magnitude ratios of the I/Q signal pairs applied to the I/Q inputs of said plurality of vector modulators and finely set according to the LO signal phases of the LO signals applied to the LO inputs of said plurality of vector modulators.

13. The method of claim 12, wherein individually controlling the I/Q magnitude ratio of each of the generated I/Q signal pairs comprises controlling the I/Q magnitude ratio of each of the generated I/Q signal pairs based on the strength or quality of a signal received at a receiving target.

14. The method of claim 9, further comprising:
amplifying said plurality of vector modulator output signals to produce a plurality of amplified vector modulator output signals;
coupling the plurality of amplified vector modulator output signals to a plurality of antennas; and
controlling a radiation angle of a composite radiation pattern produced by said plurality of antennas by individually controlling the I/Q magnitude ratios of the I/Q signal pairs applied to the I/Q inputs of said plurality of vector modulators and by controlling the LO signal phases of the plurality LO signals applied to the LO inputs of said plurality of vector modulators.

15. The method of claim 9, further comprising:
amplifying said plurality of vector modulator output signals to produce a plurality of intermediate frequency (IF) vector modulator output signals;
upconverting said IF vector modulator output signals to a plurality of radio frequency (RF) signals;
coupling the plurality of RF signals to a plurality of antennas; and
controlling a radiation angle of a composite radiation pattern produced by said plurality of antennas by individually controlling the I/Q magnitude ratios of the I/Q signal pairs applied to the I/Q inputs of said plurality of vector modulators and by controlling the LO signal phases of the plurality LO signals applied to the LO inputs of said plurality of vector modulators.

\* \* \* \* \*